United States Patent

Soref

[11] Patent Number: 5,838,870
[45] Date of Patent: Nov. 17, 1998

[54] NANOMETER-SCALE SILICON-ON-INSULATOR PHOTONIC COMPONETS

[75] Inventor: Richard A. Soref, Newton, Mass.

[73] Assignee: The United States of America as represented by the Secretary of the Air Force, Washington, D.C.

[21] Appl. No.: 808,924

[22] Filed: Feb. 28, 1997

[51] Int. Cl.⁶ .................................................. G02B 6/10
[52] U.S. Cl. .................. 385/131; 385/130; 385/132; 257/347
[58] Field of Search ............................ 385/131, 14, 42, 385/44, 49, 50, 130, 129; 365/150, 182; 257/257, 335, 347, 369, 487

[56] References Cited

U.S. PATENT DOCUMENTS

| | | | |
|---|---|---|---|
| 4,877,299 | 10/1989 | Lorenzo et al. | 350/96.14 |
| 4,996,575 | 2/1991 | Ipri et al. | 257/369 |
| 5,448,513 | 9/1995 | Hulet et al. | 365/150 |
| 5,514,885 | 5/1996 | Myrick | 257/216 |
| 5,559,912 | 9/1996 | Agahi et al. | 385/42 |

Primary Examiner—Phan T. H. Palmer
Attorney, Agent, or Firm—Robert L. Nathans

[57] ABSTRACT

Nanometer scale silicon-on-insulator (SOI) guided-wave optical components in the near infra-red employ an SOI platform for optical isolation, and single mode silicon strip etched into the buried oxide. A multi-layer core for the strip consistes of several 1–3 nanometer crystal silicon multiple quantum wells confined by wide bandgap epitaxial barriers. The MQW region of the strip employs intersubband or band-to-band photonic effects. Active strip microcavities use a photonic bandgap resonator of etched air cylinders, or two sets of etched slot Bragg grating reflectors. Many thousands of these components can be integrated on a Si chip.

40 Claims, 3 Drawing Sheets

NANOMETER-SCALE SILICON-ON-INSULATOR PHOTONIC COMPONETS

STATEMENT OF GOVERNMENT INTEREST

The present invention may be made by or for the Government for governmental purposes without the payment of any royalty therefor.

BACKGROUND OF THE INVENTION

Silicon based optoelectronic integrated circuits (OEICs) are much sought after, but little realized at present. When constructing such OEICs, it is advantageous to use optical wavelengths in the 1 to 2 $\mu$m range so that the circuit can communicate via fiber optics with external optical devices or networks. Silicon photonics has been plagued for years by two basic problems: the lack of a complete set of active-and-passive cost-effective 1–2 $\mu$m wavelength photonic components capable of opto-electronic integration; and the lack of ultra-small photonic components whose feature size is compatible with deep-sub-micron advanced silicon electronics. In 1–2 $\mu$m silicon photonics, we are seeking efficient light emitters, preferably lasers, sensitive photodetectors, fast electrooptic modulators, single mode waveguides with ultrasmall cross-section dimensions, sharp waveguide bends, wide-angle waveguide junctions, compact directional couplers, and compact interferometers. It is desired to utilize silicon-on-insulator (SOI) platforms, nanometer scale near infra-red optical waveguidestrips, molecular beam epitaxy of high-barrier Si multiple quantum wells (MQWs), tunnel injection, microcavities, RIE techniques, and tapered coupling to fibers to produce a family of desired photonic components. Also the aforementioned techniques are compatible with a Si Fab line and can provide densely packed, massively parallel Si nano photonics that can be integrated monolithically with state-of-the-art deep-submicron silicon electronics.

Very few experiments have been done on nano-scale silicon photonics. The prior -art U.S. Pat. Nos. 4,789,642, 5,163,118 and 5,354,709, of Lorenzo and Soref, disclose silicon waveguides per se. The recent experimental work of Foresi et al, [J. S. Foresi et al, "small radius bends and large angle splitters in SOI waveguides", paper in Session 3, Conference 3007, SPIE Photonics West, San Jose, 13 Feb., 1997] discloses an optical waveguide with wide-angle junctions. Those waveguides are 500 nm wide and 300 nm high. However, his waveguides do not, by themselves, give the benefits of highly desired light emission, modulation and detection.

L. C. West and colleagues have discussed ultra-high confinement of optical modes in a Ge strip guide formed upon a GaAs pedestal [L. C. West et al, paper IMH3, Integrated Photonics Research Conf, OSA, Boston, 29 Apr., 1996, A. D. Chaudhari et al, IEEE Photonic Tech. Lett., vol. 7, p. 526, 1995]. Such a guide has been tested at the 10.6 $\mu$m wavelength but not at shorter wavelengths. The deficiencies of his system are: (A) the waveguides are not transparent at the desired 1.0–1.6 micron near infra-red wavelengths, (B) the system is not silicon based and not compatible with silicon microelectronics, and (C) the active devices are not located in the core of the waveguide but rather in the cladding material, which dilutes the active effects.

It would be highly desirable to utilize silicon-on-insulator (SOI) substrates for both photonics and electronic OEICs. SOI is presently an important and expanding technology for fast, low power, sub-micron microelectronics with radiation-hardness and full-depletion features. We believe SOI will become very important in photonics. The important photonic benefits of SOI in the present invention are: First, the refractive index difference An between the $SiO_2$ lower-cladding and the Si waveguide core ($\Delta n=3.50-1.44=2.06$) is the largest index different known for any waveguide materials system; therefore this system offers the tightest mode confinement in the world, higher confinement and hence smaller dimensions than in West's prior art where $\Delta n=0.73$. Second, the $SiO_2$ layer should have a thickness of about 0.5 microns or more to prevent optical "tunnel" leakage into the Si substrate, thereby assuring low intrinsic propagation loss. Third, the optical isolation of the buried oxide allows high-Q microcavities to be formed within a strip waveguide. Fourth, the series resistance of an active diode grown upon the SOI is very low because the electrodes in this case are essentially surface electrodes located within a few microns of the device. The electrodes differ from the prior art electrode pairs that encompasses the thick Si substrate.

BRIEF SUMMARY OF PREFERRED EMBODIMENTS OF THE INVENTION

A basic photonic component for the aforesaid devices comprises a silicon-on-insulator single mode strip waveguide for transmitting optical waves in the near infra-red wavelength range and employing a silicon light transmissive strip having a lower surface portion in contact with an uppermost stairstep portion of a dielectric insulator layer, in turn contacting an underlying silicon substrate. The cross-sectional strip height is less than about 300 nanometers and the width cannot exceed one and one-half times the height. In the presently most preferred embodiment, the height and width of the strip both equal 0.2 times $\lambda$, the wavelength of strip transmitted light in free space. Typical strip cross-sections are squares, 250 by 250 nanometers in size, or about 0.2 times the wavelength of light in free space. Active multiple quantum wells with high barriers can be advantageously contained within the silicon light transmissive strip, or high Q microcavities can be formed therein. Also, the use of three new silicon on epitaxial insulator (SOEI) platforms are also described.

BRIEF DESCRIPTION OF THE DRAWINGS

Other features and advantages of the invention will become more apparent upon study of the following description, taken in conjunction with the drawings in which.

DETAILED DESCRIPTION OF EMBODIMENTS OF THE INVENTION

We shall first specify several types of SOI wafers that are suitable starting materials for the present invention. The principal type is the buried-oxide wafer made by: Bond and Etch-back (BESOI) or by Separation by IMplantation of OXygen (SIMOX). Another emerging category of SOI is the silicon-on-epitaxial-insulator (SOEI) wafer in which an epitaxial insulator is grown upon a conventional silicon wafer and a thin crystal Si film is then synthesized on the insulating layer. Besides the Si/SiO$_2$/Si substrate, we propose three new SOEI substrates: Si/BeTeSe/Si, Si/γAl$_2$O$_3$/Si and Si/CaF$_2$/Si. The first has a perfectly lattice-matched buried insulating layer of cubic BeSe$_{0.45}$Te$_{0.55}$ (bandgap=3.5 ev) and an unstrained Si top layer. The other two have a strained layer of silicon at the top of the wafer. The dielectric constant of the buried insulator of these substrates differs slightly from that of SiO$_2$ but the optical features and practical benefits of these novel SOEI wafers are similar to those of Si/SiO$_2$/Si. In the case of SOI, the oxide will be transparent at wavelengths shorter than 2.5 μm, and the Si core is transparent at wavelengths longer than 1.0 μm, giving 1.0–2.5 μm optical transmission in our novel devices. Another important substrate wafer for this invention is Ultra Thin Silicon On Sapphire (UTSOS) wafer in which 100–300 nanometers of crystal Si is grown upon a single-crystal bulk sapphire wafer. In recent months, a new UTSOS commercial process has become available, whereby although defects form in the Silicon-sapphire interface, most of these defects become eliminated in a high temperature procedure, yielding an excellent Si layer.

Figure 1:
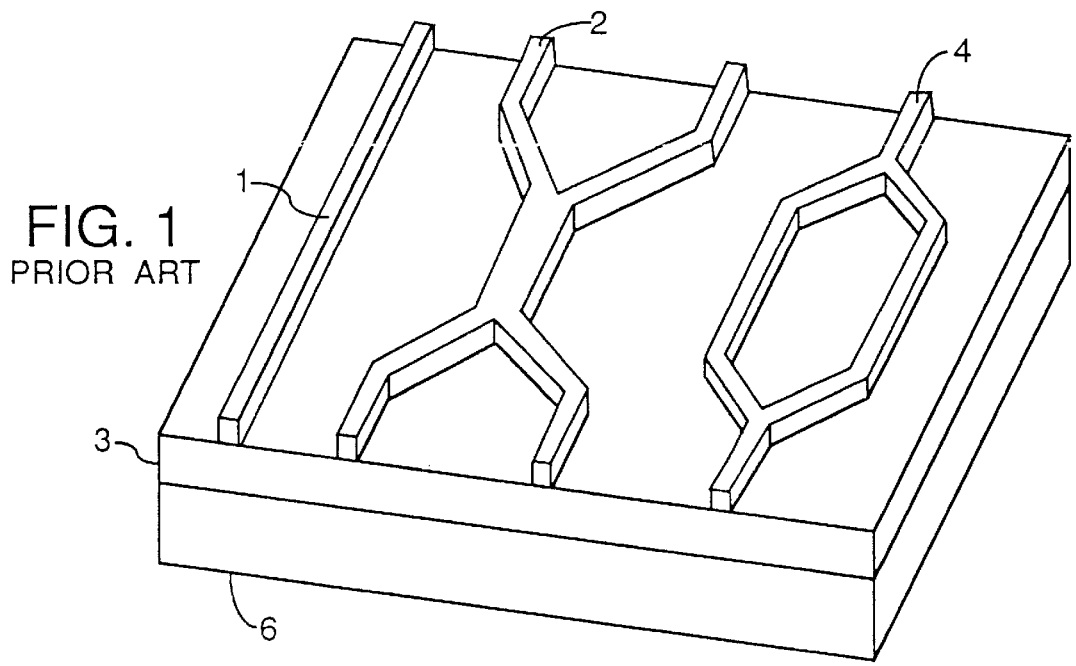
FIG. 1 illustrates various prior art applications of the novel strip waveguide of the invention.
Figure 2:
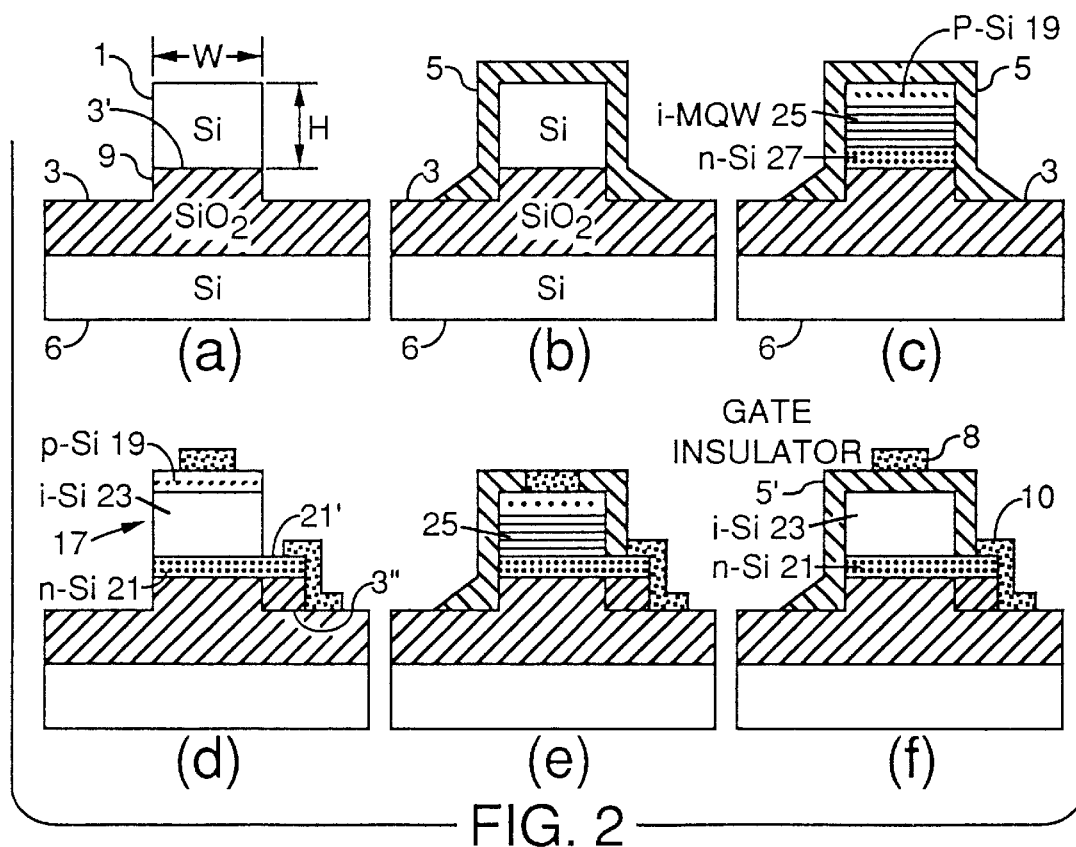
FIG. 2 illustrate cross sectional views of the strip waveguide of the invention.

Our basic photonic component, the optical strip waveguide of this invention is the single mode Si-strip/SOI waveguide 1, situated over silicon dioxide dielectric insulating layer 3 and silicon substrate 6, as shown in FIGS. 1 and 2a. A conventional directional coupler 2 and Mach-Zender interferometer 4 are also indicated in FIG. 1. In the cross sectional view of waveguide 1, a 250 nm high Si top layer 1 is etched through the aforesaid Si top starting material wafer layer and down into the dielectric insulator layer 3 (slightly) at 9 to form the rectangular waveguide strip 1 as indicated in FIG. 2 (a). The entire uppermost "mesa" portion of the resulting stairstep 3', now contacts the lower silicon strip portion as shown. This is in contrast to the larger sized rib waveguide disclosed in FIG. 1(a) of U.S. Pat. No. 4,877,299. The prior art rib waveguide has silicon "wings" extending from either side of the central rectangular silicon waveguide area, in contrast with the strip waveguide of the present invention. Our strip 1 may be surrounded on three sides by air; or, as in FIG. 2b, a SiO$_2$ cladding-and-passivation layer 5 may be deposited to surround the strip. The optical properties of FIG. 2b are very similar to those of FIG. 2a. The silicon strip-on-sapphire (strip-SOS) looks like FIG. 2a, without the lower silicon substrate Waveguide mode-analysis shows that the strip supports only the fundamental $E_{11}^x$ mode (vertical polarization) and the $E_{11}^y$ mode (horizontal polarization) if the width of the strip (W) and the height of the strip (H) are made less than critical values. Specifically, when W=H, the single-mode condition from the theory of Marcatilli and Goell is H(max)= $0.7\lambda(n_2^2-n_1^2)^{-\frac{1}{2}}$, where $n_2$ is the Si core index, $n_1$ is the SiO$_2$-surround index, and λ is the free-space optical wavelength.

For W=H, the usable range of H is between 0.14λ and 0.22λ, where lambda λ is the strip transmitted wavelength of light in free space, and the result 0.12λ<H<0.18λ is found for W=1.5 H. Taking the optimum W=H, we then find that the practical waveguide dimensions are H=220 nm at λ=1000 nm; 286 nm at λ=1300 nm and 352 nm at λ=1600 nm. If W and H are reduced, for example, 20% below these values, so that H never exceeds 300 nanometers, the fundamental mode will expand its spatial diameter. The evanescent optical "tail" extending beyond the Si core then makes the strip more sensitive to surface roughness and increases the optical propagation loss. Indeed, the propagation loss is determined in practice by the surface roughness on the Si strip [a "processing parameter"] rather than by inherent material loss, since material loss is <1 dB/cm for 500 nm buried oxide. That roughness is governed by the smoothness of the etching process. We propose that reactive ion etching (RIE) will produce surface irregularities that are sufficiently small so that the loss of the Si strip in the near infrared will be less than 5 dB per cm of guide.

To form typical 250 nm×250 nm strip channel waveguides, we propose a fabrication procedure similar to that of Liu [Appl. Phys. Lett. vol 68, p 170, 1996], who etched narrow trenches in Si. Our SOI—Si layer is first covered with "thick" SiO$_2$. That oxide is then covered with polymethyl methacrylate (PMMA). The 250 nm waveguide channel width is then defined by electron beam direct writing on the PMMA. Fluorine-based RIE transfers the pattern from developed PMMA into the SiO$_2$. The patterned SiO$_2$ then serves an etch mask for 260-nm-deep chlorine-based RIE of Si. This gives the nano-scale strips with smooth-enough side walls. E-beam lithography allows complex waveguide shapes to be fabricated, such as strip bends with a micron sized radius of curvature, or Y-shaped waveguide junctions illustrated in FIG. 1, for dividing or combining guided optical signals [See J. S. Foresi et al, above reference]. The spatial packing density of these curved and straight waveguides is higher than that of any prior-art optical waveguide. Parallel nanometer-scale guides allow parallel data transport, rather than time-division serialized data transport on one larger waveguide. Parallel interconnects are natural partners to VLSICs with their multiplicity of in/out signals.

Figure 3:
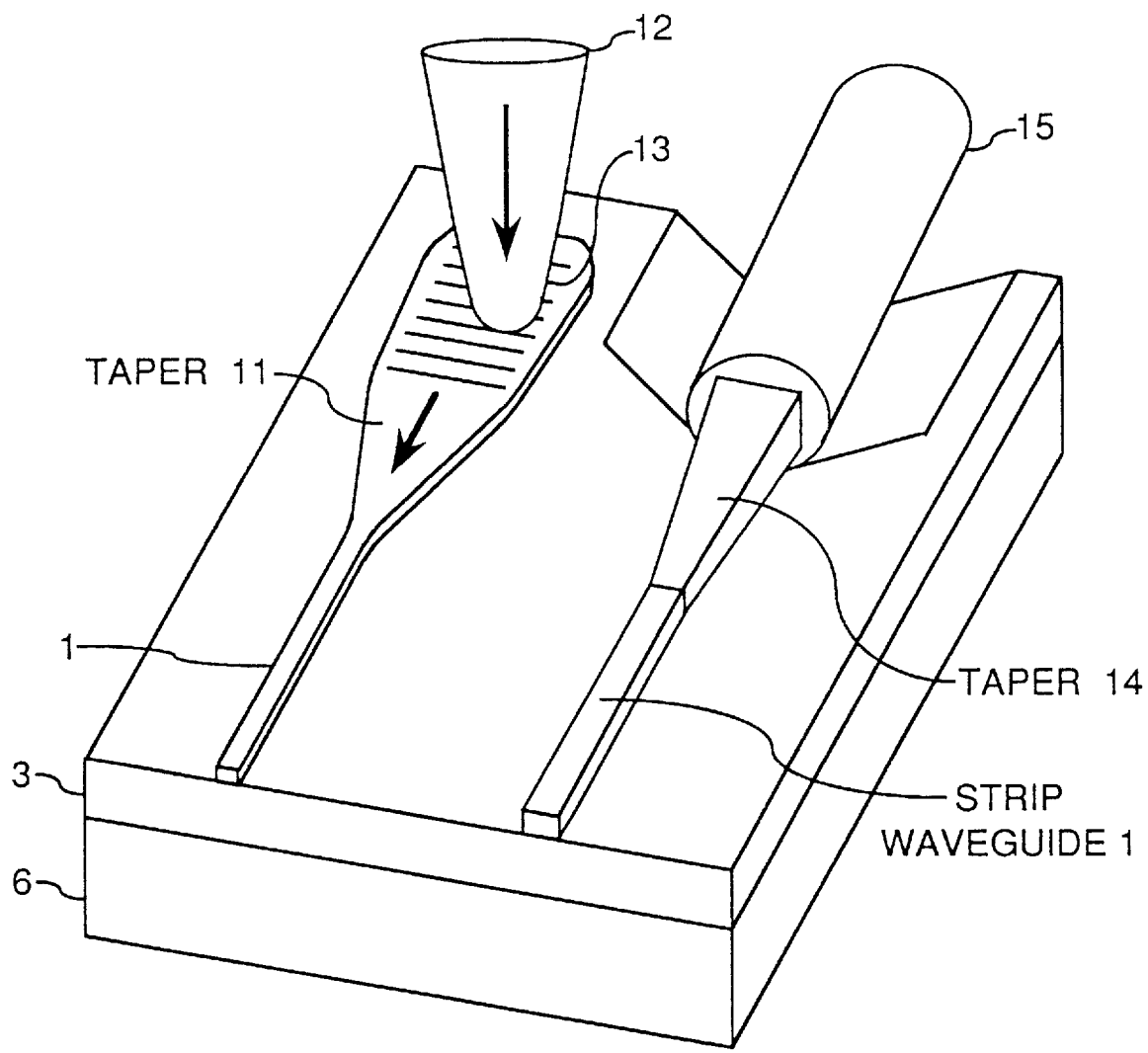
FIG. 3 illustrates devices for accessing the strip waveguide.

FIG. 3 illustrates the means for coupling a light beam 12 from free space into the strip waveguide 1, and for coupling light from a fiber optic waveguide 15 into the strip guide and vice versa. The first case consists of a one-dimensional adiabatic lateral taper portion 11 of the Si strip 1, widening it to about 2 μm. A surface corrugation grating 13 is formed in the widened Si region. The grating converts the optical radiation mode into the guided mode; then the taper concentrates that energy into a smaller cross section. A two-dimensional adiabatic taper 14, tapered in both height and width, is employed to widen the Si strip cross-section to about 4 μm×4 μm in order to efficiently end-couple it to the core of a single-mode fiber 15. In contrast to the FIG. 3 input/output coupling to the chip, the on-chip optical coupling between various strip devices is lithographically defined (monolithic) and has low loss.

FIG. 2c,d,e,f show our techniques for fabricating active (electro optical) strip-waveguide devices. The device cross sections are indicated. The present EO devices are either p-i-n or n-i-n or p-i-p diodes 17. Taking the p-i-n as an example, the top of the strip consist of a 30 to 50-nm thick cap layer of p-type crystal Si 19, shown in FIG. 2d, and at the bottom of the strip there is a 30 to 50-nm-thick layer of n-type Si 21. The middle of the strip 23 is often not intentionally doped (intrinsic) as in FIG. 2d. For the more important case, FIG. 2c includes a MQW stack 25 grown upon the bottom doped-Si layer 27, forming the active MQW core in a p-i-n device.

In the strip devices, it is not easy to gain electrical access to the lower doped layer 21. We employ a localized lateral extension of this doped layer, which we call a doped "sidearm" 21' for electrical contact to the lowest region of the strip. The sidearm 21' is a nano-scale rectangle of doped Si, formed by lithography and etching, an arm that rests upon the SiO$_2$ insulating layer at 3". This is illustrated in FIGS. 2d,e,f. FIG. 2f shows an MOS diode formed by using the upper oxide 5' as a gate insulator. An strip MOSFET is feasible if two sidearms are deployed on that strip. As understood in the art, gate electrode 8 and electrode 10 are added as shown.

The key active devices in this invention use a 150-nm thick MQW 25 with high barriers in the intrinsic region 23 where the quantum wells (QWs) include layers of crystal Si typically 1 to 3 nm thick. Since we seek 1–2 micron near infrared operation, and since we are primarily using optical transitions between subbands in the QWs, the bandoffsets must be of the order of 1.5 eV, that is the valence band offset between the Si QW and the barrier, or the conduction band offset (or both) must be about 1.5 eV. At the same time, we prefer that the lattice parameter of the barrier crystal should match, or nearly match the lattice of Si because unstrained-layer systems are technologically better than strained-layer systems. These constraints narrow the range of barrier material.

The QWs in the MQW 25 are crystal Si. If the barrier regions between QWs have a wide bandgap (which is optimum), then the index of refraction of the MQW "averaged" over 150 nm of height is slightly less than the Si index, for example, $n_{ave} \sim 3.1$. At first glance, this would seem to make the MQW waveguide leaky. However, the insulator layer 3 below the strip, and the oxide layer 5 (or air) above the strip, offer very strong trapping of light in the MQW of FIGS. 2c,e,f which is an important aspect of the invention. Thus, guiding is strong in the SOI p-i-n MQW strip.

Figure 4:
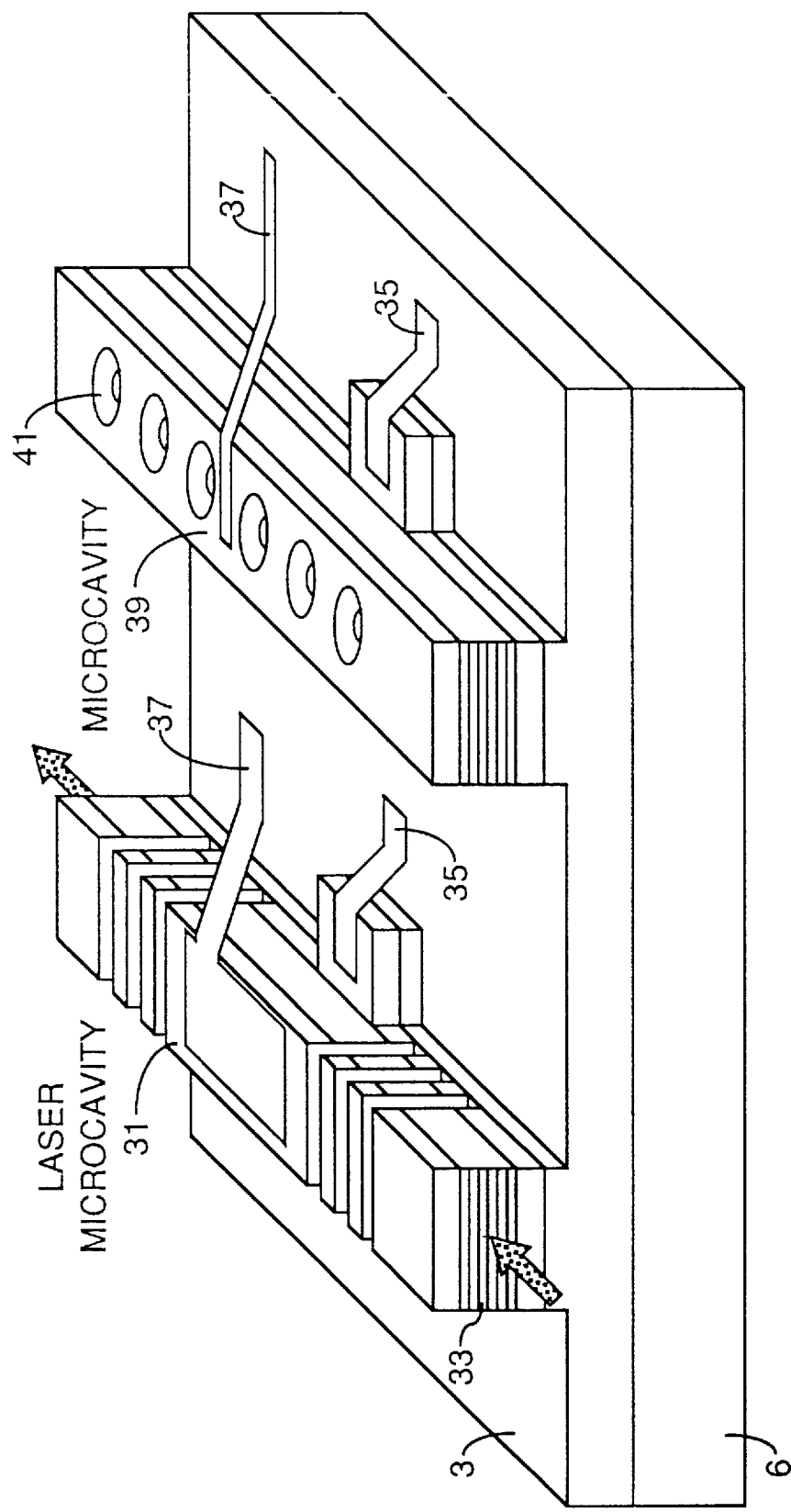
FIG. 4 illustrates further applications of the strip waveguide of the invention.

A key aspect of the insulating lower cladding layer (SOI construction) is that it makes possible high-Q optical resonators in the strip guide as shown in FIG. 4, because of the large index step and the consequent optical isolation. The sidearm 21' mentioned above, to facilitate electrical contact, does not disturb the cavity Q significantly if the sidearm is located at an "end" of the cavity. The sidearm occupies only a fraction of the guide height.

The 1 to 2 μm MQW laser 31 in FIG. 4, has Si QWs with high barriers of BeTeSe, or $SiO_2$, $CaF_2$ or $Al_2O_3$. Each period of the p-i-p or n-i-n superlathice 33 has coupled QWs or a single QW with local-in-k inversion. The quantum parallel laser structure of Friedman et al [IEEE PTL, 1996] can be employed. There are one to four active periods. Drive voltage applied via electrodes 35 and 37 is about 1.5 V. The microcavity consists either of deeply etched Bragg grating reflectors (mdGRs) or a one-dimensional photonic band gap T BG) resonator similar to that in P. R. Villeneuve et al, Appl. Phys. Lett., vol. 67, p. 167, 10 Jul., 1995, except that their SOI waveguide was 500 nm high and 4000 nm wide with holes 2000 nm diam on 3000 nm centers: whereas in our microcavity 39 of FIG. 4, the strip waveguide is about 200 nm×200 nm with 100 nm diam holes 41 on 150-nm-spaced centers. The physics of PBG filters is also discussed in J. C. Chen et al, IEEE J. of Lightwave Technology, vol. 14, p. 2575, November 1996.

Some modulators and photo detectors employing the present invention, also can make use of microcavities in some applications, although in those cases the spectral response band is narrow and must be tuned to the laser wavelength. The first type of modulator is an MOS-gate depleter of a doped Si strip-guide (doping density $4 \times 10^{17}$ or $1 \times 10^{18}$ $cm^{-3}$). Operation is via the free carrier plasma effect. For intensity modulation, an MZ configuration converts phase modulation into amplitude modulation. The second type of modulator is a doped Si QW which has a strong intersubband absorption feature near the laser wavelength. The optical transmission of the guide changes via the electroabsorption effect in this n-i-n or p-i-p device: a 50 μm long strip or a cavity device shorter than 50 microns. The third type of modulator injects free carriers into bulk Si via a Schottky contact. This diode does not always require the doped bottom layer contact because interdigitated metal contacts (MSM) can be formed on the top of the strip. The light emitting diode is either the λ=1 to 2 μm intersubband MQW laser operated below threshold, or it is an MQW that emits enhanced band-to-band radiation at about 1 μm.

The first type of photodetector employing the present invention can be a room-temperature, internal-photoemission $CoSi_2$/Si Schottky-barrier photodiode with 2 to 4% quantum efficiency and broad-spectrum response. Here a microcavity gives higher responsivity with narrower spectral sensitivity. The second type of photodetector is an n-i-n or p-i-p doped Si MQW (high barriers) featuring strong intersubband absorption at the laser wavelength in the 1 to 2 μm band with about 10% quantum efficiency. The third type of photodetector employs a strained-layer of SiGe within the strip body, a band-to-band absorber, surrounded by p- and n-doped Si layers.

Thus, it should now be appreciated that the present invention can provide nanometer-scale active and passive silicon-on-insulator (SOI) guided-wave components; lasers, LEDs, amplifiers, photodetectors, modulators, switches, waveguides and couplers for 1.0–1.6 μm wavelengths. Tens of thousands of the photonic components can be integrated on a Si chip using novel single-mode strip/SOI guides typically having 200–250 nanometer cross-sectional dimensions, micron-sized radius bends, wide-angle splitting-or-combining junctions and polarization-independent propagation in the fundamental $E_{11}^x$ or $E_{11}^y$ mode. The components can be monolithically integrated with deep-submicron Si electronics to create low-cost Si VLSI-OEICs. Many of the active components can use p-i-n or p-i-p or n-i-n Si multiple quantum well (MQW) structures within micro-cavity waveguides comprised of 1 D photonic-bandgap resonators or deeply etched Bragg grating reflector resonators. The MQW consists of Si layers (1 to 3 nm thick) quantum confined by lattice-matched high barriers of $SiO_2$, or c-ZnS, BeSeTe, $CaF_2$, or $\gamma$-$Al_2O_3$. Lasers use the quantum parallel structure. Modulators are free carrier or intersubband devices. Detectors use Schottky barriers. LEDs are band-to-band or intersubband emitters.

While preferred embodiments have been described, variations on the above will readily occur to the worker in the art, and thus the scope of the invention is to be defined solely by the terms of the following claims and art recognized equivalents thereof.

What is claimed is:

1. A silicon-on-insulator single mode waveguide for transmitting optical waves in the near infra-red wavelength range comprising:
   (a) a silicon light transmissive strip having a lower surface portion, a cross sectional height H of less than about 300 nanometers and wherein said lower surface portion has a cross sectional width of less than 1–5 H;
   (b) a dielectric insulating layer having an upper surface portion underlying the lower surface portion of said light transmissive strip, and a lower surface portion;
   (c) a silicon substrate having an upper surface portion underlying the lower surface portion of said dielectric insulating layer.

2. The waveguide of claim 1 wherein the height and width of said silicon light transmissive strip both equal about 0.2 times the wavelength of light in free space transmitted therethrough.

3. The waveguide of claim 2 wherein said dielectric insulating layer is selected from the group consisting of $SiO_2$, BeTeSe, gamma-$Al_2O_3$, and $CaF_2$.

4. The waveguide of claim 3 wherein said dielectric insulating layer has a stairstep portion formed thereon and having the entire uppermost surface portion of said stairstep portion in contact with the lower surface portion of said silicon light transmissive strip.

5. The waveguide of claim 3 wherein said silicon light transmissive strip includes active multiple quantum wells with high barriers formed in a core portion thereof.

6. The waveguide of claim 2 wherein said dielectric insulating layer has a stairstep portion formed thereon and having the entire uppermost surface portion of said stairstep portion in contact with the lower surface portion of said silicon light transmissive strip.

7. The waveguide of claim 2 wherein said silicon light transmissive strip includes active multiple quantum wells with high barriers formed in a core portion thereof.

8. The waveguide of claim 2 wherein said silicon light transmissive strip includes a high Q microcavity formed therein.

9. The waveguide of claim 1 wherein said dielectric insulating layer is selected from the group consisting of $SiO_2$, BeTeSe, gamma-$Al_2O_3$, and $CaF_2$.

10. The waveguide of claim 9 wherein said dielectric insulating layer has a stairstep portion formed thereon and having the entire uppermost surface portion of said stairstep portion in contact with the lower surface portion of said silicon light transmissive strip.

11. The waveguide of claim 9 wherein said silicon light transmissive strip includes active multiple quantum wells with high barriers formed in a core portion thereof.

12. The waveguide of claim 9 wherein said silicon light transmissive strip includes a high Q microcavity formed therein.

13. The waveguide of claim 1 wherein said dielectric insulating layer has a stairstep portion formed thereon and having the entire uppermost surface portion of said stairstep portion in contact with the lower surface portion of said silicon light transmissive strip.

14. The waveguide of claim 13 wherein said silicon light transmissive strip includes active multiple quantum wells with high barriers formed in a core portion thereof.

15. The waveguide of claim 13 wherein said silicon light transmissive strip includes a high Q microcavity formed therein.

16. The waveguide of claim 1 wherein said silicon light transmissive strip includes active electro-optic multiple quantum wells with high barriers formed in a core portion thereof.

17. The waveguide of claim 1 wherein said silicon light transmissive strip includes a high Q microcavity formed therein.

18. The waveguide of claim 1 wherein said dielectric insulating layer has a thickness of 0.5 microns or more.

19. A silicon-on-insulator single mode waveguide for transmitting optical waves in the near infra-red wavelength range comprising:
(a) a silicon light transmissive strip having a rectangular cross section, an upper and lower surface portion, a height H of less than 300 nanometers and a width of less than 1.5 H;
(b) a dielectric insulating layer having an upper surface portion in contact with the lower surface portion of said light transmissive strip, and a lower surface portion; and
(c) a silicon substrate having an upper surface portion in contact with the lower surface portion of said dielectric insulating layer.

20. The waveguide of claim 19 wherein the height and width of said silicon light transmissive strip both equal about 0.2 times the wavelength of light in free space transmitted therethrough.

21. The waveguide of claim 20 wherein said dielectric insulating layer is selected from the group consisting of $SiO_2$, BeTeSe, gamma-$Al_2O_3$, and $CaF_2$.

22. The waveguide of claim 21 wherein said dielectric insulating layer has a stairstep portion formed thereon and having the entire uppermost surface portion of said stairstep portion in contact with the lower surface portion of said silicon light transmissive strip.

23. The waveguide of claim 21 wherein said silicon light transmissive strip includes active multiple quantum wells with high barriers formed in a core portion thereof.

24. The waveguide of claim 21 wherein said silicon light transmissive strip includes a high Q microcavity formed therein.

25. The waveguide of claim 20 wherein said dielectric insulating layer has a stairstep portion formed thereon and having the entire uppermost surface portion of said stairstep portion in contact with the lower surface portion of said silicon light transmissive strip.

26. The waveguide of claim 20 wherein said silicon light transmissive strip includes a high Q microcavity formed therein.

27. The waveguide of claim 20 wherein said silicon light transmissive strip includes active multiple quantum wells with high barriers formed in a core portion thereof.

28. The waveguide of claim 19 wherein said dielectric insulating layer is selected from the group consisting Of $SiO_2$, BeTeSe, gamma-$Al_2O_3$, and $CaF_2$.

29. The waveguide of claim 28 wherein said dielectric insulating layer has a stairstep portion formed thereon and having the entire uppermost surface portion of said stairstep portion in contact with the lower surface portion of said silicon light transmissive strip.

30. The waveguide of claim 28 wherein said silicon light transmissive strip includes active multiple quantum wells with high barriers formed in a core portion thereof.

31. The waveguide of claim 28 wherein said silicon light transmissive strip includes a high Q microcavity formed therein.

32. The waveguide of claim 19 wherein said dielectric insulating layer has a stairstep portion formed thereon and having the entire uppermost surface portion of said stairstep portion in contact with the lower surface portion of said silicon light transmissive strip.

33. The waveguide of claim 32 wherein said silicon light transmissive strip includes active multiple quantum wells with high barriers formed in a core portion thereof.

34. The waveguide of claim 19 wherein said silicon light transmissive strip includes active electro-optic multiple quantum wells with high barriers formed in a core portion thereof.

35. The waveguide of claim 19 wherein said silicon light transmissive strip includes a high Q microcavity formed therein.

36. The waveguide of claim 19 wherein said dielectric insulating layer has a thickness of 0.5 microns or more.

37. A silicon-on-insulator single mode waveguide for transmitting optical waves in the near infra-red wavelength range comprising:

(a) a silicon light transmissive strip having a square cross section, the sides of said square cross section having a length of about 0.2 times the wavelength of light in free space transmitted therethrough;

(b) a dielectric insulating layer having an upper surface portion in contact with a lower surface portion of said light transmissive strip, and a lower surface portion; and (c) a silicon substrate having an upper surface portion in contact with the lower surface portion of said dielectric insulating layer.

38. The waveguide of claim 37 wherein the sides of said square cross section are equal to about 250 nanometers.

39. The waveguide of claim 37 wherein said dielectric insulating layer has a thickness of 0.5 microns or more.

40. A silicon-on-insulator single mode waveguide for transmitting optical waves in the near infra-red wavelength range comprising:

(a) a crystal silicon light transmissive strip having a lower surface portion, a cross sectional height H of less than about 300 nanometers and wherein said lower surface portion has a cross sectional width of less than 1.5 H; and (b) a dielectric insulating layer of single crystal bulk sapphire having an upper surface portion underlying the lower surface portion of said light transmissive strip.

* * * * *

UNITED STATES PATENT AND TRADEMARK OFFICE
CERTIFICATE OF CORRECTION

PATENT NO. : 5,838,870

DATED : 17 November 1998

INVENTOR(S) : Richard A. Soref

It is certified that error appears in the above-identified patent and that said Letters Patent is hereby corrected as shown below:

In claim 1, on line 7, change "1-5" to -- 1.5 -- .

Signed and Sealed this

Twenty-third Day of March, 1999

Attest:

Q. TODD DICKINSON

Attesting Officer

Acting Commissioner of Patents and Trademarks